United States Patent
Hsu et al.

(10) Patent No.: US 7,081,402 B2
(45) Date of Patent: Jul. 25, 2006

(54) SEMICONDUCTOR PACKAGE SUBSTRATE HAVING CONTACT PAD PROTECTIVE LAYER FORMED THEREON AND METHOD FOR FABRICATING THE SAME

(75) Inventors: Shih-Ping Hsu, Hsin-chu (TW); Kun-Chen Tsai, Hsin-chu (TW)

(73) Assignee: Phoenix Precision Technology Corporation (CN)

( * ) Notice: Subject to any disclaimer, the term of this patent is extended or adjusted under 35 U.S.C. 154(b) by 0 days.

(21) Appl. No.: 10/695,356

(22) Filed: Oct. 27, 2003

(65) Prior Publication Data
US 2005/0037601 A1    Feb. 17, 2005

(30) Foreign Application Priority Data
Aug. 13, 2003   (TW)   ............... 92122202 A

(51) Int. Cl.
*H01L 21/44* (2006.01)
(52) U.S. Cl. .............. 438/612; 438/614; 438/108
(58) Field of Classification Search ........... 438/612, 438/671, 672; 257/779
See application file for complete search history.

(56) References Cited

U.S. PATENT DOCUMENTS

| | | | |
|---|---|---|---|
| 5,907,786 A * | 5/1999 | Shinomiya | 438/614 |
| 6,566,239 B1 * | 5/2003 | Makino et al. | 438/612 |
| 2004/0000427 A1 * | 1/2004 | Wang et al. | 174/256 |

* cited by examiner

*Primary Examiner*—Jack Chen

(74) *Attorney, Agent, or Firm*—Fulbright & Jaworski L.L.P.

(57) ABSTRACT

A semiconductor package substrate and a method for fabricating the same are proposed. An insulating layer has a plurality of blind vias to expose inner traces underneath the insulating layer. A conductive film is formed on the insulating layer and over the bind vias. A first resist is formed on the conductive film, having openings to expose parts of the conductive film. A patterned trace layer including a plurality of contact pads is formed in the openings and the blind vias to form conductive vias, with at least one contact pad electrically connected to one conductive via. A second resist is formed on the patterned trace layer without covering the contact pads. A metal barrier layer is formed on the contact pads. Finally, the first and second resists and parts of the conductive film covered the first resist are removed.

7 Claims, 9 Drawing Sheets

SEMICONDUCTOR PACKAGE SUBSTRATE HAVING CONTACT PAD PROTECTIVE LAYER FORMED THEREON AND METHOD FOR FABRICATING THE SAME

BACKGROUND OF THE INVENTION

1. Field of the Invention

The present invention relates to semiconductor package substrates having contact pad protective layers formed thereon and methods for fabricating the same, and more particularly, to a semiconductor package substrate having a contact pad protective layer formed thereon and a method for fabricating the same, such that a metal protective layer is formed on the contact pad of the substrate while the substrate circuit and conductive vias are fabricated.

2. Description of the Related Art

In the trend to develop an electrical device that is compact, multi-functional, and operated at high speed and high frequency, technology in Printed Circuit Board (PCB) and Integrated Circuit (IC) package substrate has been directed to develop the electrical device with thinner circuit and smaller apertures. The circuit dimensions including line width, trace space, and aspect ratio have been reduced from 100 μm and above in the conventional process to 30 μm in current fabrication process for PCB or IC package substrate. And research for developing the device with smaller circuit precision is now underway.

Typically, a conventional etching method incurring with lower cost and less etching time is usually adopted when the dimension of conductive trace is above 40 μm. Referring to FIGS. 1A and 1B, a metal layer 11 is formed on an insulating layer 10, followed by coating a resist layer 12 on the metal layer 11. Next, in a wet etching method, a strong acid or alkaline etchant 13 has diffused to react with surface molecules of the metal layer 11 to complete the removal by etching. Besides having a higher etching rate and lower cost, such subtractive etching method is also beneficial in terms of higher thickness uniformity for conductive layer after etching. As the etching is achieved through a chemical reaction between the etchant 13 and the specific materials, it has a better etching selectivity than other methods. So, other materials not to be etched are not removed. Since the wet etching method is an isotropic etching, an undercut 14 results as shown in FIG. 1B to affect the process precision when a downward etching is performed. Such wet etching method is limited in precision of mass transport, making the conductive trace to be etched harder to be developed into smaller dimension.

For the dry etching method that is commonly adopted in the semiconductor process, an anisotropic etching characteristics thereof may lead to a finer etching precision and smaller line width for the conductive trace, regardless of sputtering etching or plasma etching. However, such dry etching method with a low etching rate (a few nanometers for each minute) is only suitable for the thinner semiconductor chip, but not for the thicker package substrate (5 to 30 μm) as more time and cost are spent to perform dry etching in this case. Meanwhile, the dry etching method is a physical etching method that bombards the etching surface with ions and has poor etching selectivity. So, if the dry etching method is adopted in the entire process for fabricating the package substrate, the conductive layer may have been polluted.

Instead of the conventional subtractive etching method, an additive etching method is currently adopted for fabricating finer circuits in the industry to fulfill requirement for circuit board of higher density. Conventionally, this method is achieved by forming a seed layer with electroless copper on the insulating circuit board, followed by forming a circuit layer directly above the insulating layer to prevent problems encountered during etching. The method is sub-divided into a fully additive process and a semi-additive process.

A typical semi-additive process for fabricating a finer circuit is illustrated in FIGS. 2A through to 2F.

Referring to FIG. 2A, a core circuit board 20 has a plurality of patterned circuit layers 21, an insulating layer 22 located between two circuit layers 21, and a plated through hole (PTH) 23 for interconnecting the circuit layers 21.

As shown in FIG. 2B, two organic insulating layers 24 are further mounted by vacuum compression on surfaces of the core circuit board 20.

Referring to FIG. 2C, the organic insulating layers 24 are patterned to form a plurality of openings 240 for exposing parts of the circuit layer 21. An electroless copper film 25 is formed on each of the organic insulating layers 24 and covers the openings 240.

Referring to FIG. 2D, a patterned resist layer 26 is formed on the electroless copper film 25 such that a plurality of openings 260 are formed in the patterned resist layer 26 to expose parts of the electroless copper film 25.

Referring to FIG. 2E, a trace layer 27 is formed in the opening by electroplating, wherein the electroplated metal layer is generally a conductive trace made of copper.

Referring to FIG. 2F, a four layers stacked substrate 200 is formed after the resist layer 26 and parts of the electroless copper film 25 covered by the resist layer 26 are removed.

A plurality of conductive traces made of copper are formed on a surface of the semiconductor package substrate, with parts of the surface form contact pads for transmitting electrical signals or power. A metal layer, such as nickel (Ni)/gold (Au) layer is commonly formed on exposed surface of the contact pads to provide the contact pads with such as Au wires, bumps or solder balls for an effective electrical coupling to conductive devices such as chips or circuit boards. Thus, the contact pads are prevented from being oxidized by the external environment.

The contact pads may be the bump pads or presolder pads for coupling electrically the flip chip package substrate to the chip. The contact pads may also be fingers for coupling electrically the wire-bonded package substrate to the chip or ball pads for coupling electrically the package substrate to the circuit board. A Ni/Au metal layer is formed on exposed surface of the contact pads to protect the contact pads (usually copper (Cu)) from being oxidized by external environment, so as to improve connection for the bumps, presolders, or solder balls mounted on the contact pads.

Since the electroless copper film used for entire connection in the current semi-additive process (SAP) is removed by etching after the pattern plating process, a process for forming a solder masking agent (i.e. green paint) is performed on the substrate to protect the electroplated trace layer from being oxidized. And openings are formed in the solder mask to expose the surfaces of the contact pads for forming the Ni/Cu metal layer. As the electroless copper film has been removed, the formation of the Ni/Au metal layer has to be carried out by an electroless method, i.e. adopting a driving force without application of external voltage.

FIGS. 2G through to 2H illustrate a conventional electroless method for forming the metal barrier layer on contact pads of the substrate, i.e. formation of nickel (Ni)/gold (Au) metal layer by a chemical deposition process.

Referring to FIG. 2G, as described above, a substrate 200 which is formed with a patterned circuit layer 27 in the front-end process, is printed or coated with a solder mask, such as a green paint. The circuit layer 27 comprises a plurality of contact pads 270 that are exposed by openings 280 formed in the solder mask 28, in order to correctly deposit the Ni/Au metal layer on the contact pads.

Referring to FIG. 2H, during the chemical deposition process, the substrate 200 is subjected to an Electroless Nickel/Immersion Gold (EN/IG) process, where a Ni/Au metal layer 29 is deposited via the openings 280 on surfaces of the contact pads 270 exposed by the openings 280.

Thus, as described above, the electroless copper film for interconnecting the electroplated patterned traces in the SAP is removed after the trace patterning, the Ni/Au metal layer is subsequently formed in an electroless method. The typical liquid adopted in the conventional chemical deposition method usually results a corrosive attack to the solder mask formed on the package substrate, causing peeling of the solder mask and poor reliability as a result of pollution for the Ni/Au metal layer on the contact pads.

And to meet the market demand, semiconductor manufacturers are eagerly involved in developing the semiconductor package with a more compact size as well as the chip of smaller size and higher integration. So, the semiconductor package substrate that serves as a chip carrier is formed with contact pads in high density, so that the chip carried on the substrate forms an excellent and complete connection with the substrate, and the highly integrated chip operates smoothly to develop its functions and properties. However, as the IC package substrate formed with the conductive traces is limited in terms of its fabrication process, limitations in the transmission chip signal and functions to improve bandwidth and control resistance thereof deters development in a high input/output (I/O) package. As the IC process width has been reduced down to 0.13 µm for the semiconductor chip, the package size is also constantly reduced until it almost reaches the same size of the chip (about 1.2 times the size of the chip). Therefore, development in the package substrate with fine circuit, high density, and small apertures is in no doubt an important research topic for IC industry and other related electronic industries to advance to the technology of next generation since the substrate process occupies 20% to 50% of the package cost.

And if the conductive trace is developed to achieve a higher precision, dimensions of the contact pad as well as a pitch between two neighboring contact pads need to be further reduced. As a result, the openings that form in the solder mask become too small to expose the contact pads, causing poor fluid convection in the chemical Ni/Au deposition process, and further leading to poor mass transfer for the Ni particles without full Ni plating. So, the Ni metal layer is not successfully plated by immersing in deposited Au, resulting either a skip in electroplating or a surface of the contact pad which is too rough to form a dense Ni/Au metal layer.

SUMMARY OF THE INVENTION

The primary objective of the present invention is to provide a semiconductor package substrate having a contact pad protective layer formed thereon and method for fabricating the same, whereby a metal barrier layer is formed on the contact pad by electroplating.

Another objective of the present invention is to provide a semiconductor package substrate having a contact pad protective layer formed thereon and method for fabricating the same, whereby a metal barrier layer is formed on the contact pad by integrating a semi-additive process (SAP) that forms the circuit structure and an electroplating method.

A further objective of the present invention is to provide a semiconductor package substrate having a contact pad protective layer formed thereon and method for fabricating the same, so that a corrosive attack of the solder mask from the liquid in the conventional chemical Ni/Au deposition process is prevented, and poor reliability as a result of solder mask peeling and pollution for the Ni/Au metal layer on the contact pads is eliminated.

And yet another objective of the present invention is to provide a semiconductor package substrate having a contact pad protective layer formed thereon and method for fabricating the same, so as to prevent poor mass transfer for the Ni particles without full Ni plating due to the poor fluid convection in the chemical Ni/Au deposition process. Thereby, the semiconductor package substrate and method for fabricating the same improves from the prior art where the Ni metal layer is not successfully plated by immersing in deposited Au, resulting either a skip in electroplating or a surface of the contact pad which is too rough to form a dense Ni/Au metal layer.

In accordance with the above and other objectives, the present invention proposes a method for fabricating a semiconductor package substrate having a contact pad protective layer formed thereon. The fabrication method begins by providing an insulating layer with a plurality of blind vias to expose inner traces underneath the insulating layer. A conductive film is formed on the insulating layer to cover the blind vias. A first resist layer is formed on the conductive film, such that a plurality of openings are formed in the first resist layer to expose parts of the conductive film. A first electroplating process is performed to form a patterned trace layer in the openings and a conductive vias in the blind vias. The patterned trace layer includes a plurality of contact pads, and at least one of the contact pads is connected to the conductive vias. A second resist layer is formed to cover parts of the patterned trace layer outside the contact pads, so that the contact pads are exposed by the second resist layer. A second electroplating process is performed to form a metal barrier layer on the contact pads. The second resist layer, the first resist layer, and parts of the conductive film covered by the first resist layer are removed.

In another embodiment, the present invention proposes another method for fabricating a semiconductor package substrate having a contact pad protective layer formed thereon. The method begins by providing an insulating layer with a plurality of blind vias to expose inner traces underneath the insulating layer. A conductive film is formed on the insulating layer to cover the blind vias. A resist layer is formed on the conductive film, such that a plurality of openings are formed in the resist layer to expose parts of the conductive film. A first electroplating process is performed to form a plurality of contact pads in the openings and a conductive vias in the blind vias, such that one of the contact pads is connected to the conductive vias. A second electroplating process is performed to form a metal barrier layer on the contact pads. The resist layer, and parts of the conductive film covered by the resist layer are removed. The openings in the resist layer correspond to locations of the blind vias in the insulating layer.

With the processes described above, the present invention proposes a semiconductor package substrate having a contact pad protective layer formed thereon. The substrate comprises at least an insulating layer with a plurality of blind vias to expose inner traces underneath the insulating layer, at least a patterned circuit layer which is formed by electroplating via a conductive layer on the insulating layer, and at least a metal barrier layer completely covers an upper surface of the contact pads. The patterned circuit layer further comprises a plurality of contact pads, and one of the contact pads connected to the conductive vias.

According to the present invention, the conductive film required for electroplating and the second resist layer are used to perform pattern transfer when the patterned circuit layer and blind vias are fabricated by the SAP. So, areas to be electroplated with a metal layer (such as a Ni/Au metal layer) are defined. Alternatively, the contact pad area may be formed only on the substrate, such that a Ni/Au metal layer having a size identical to the contact pad is formed on an upper surface of the contact pads using a Ni/Au electroplating process in order to prevent a variety of process problems caused by conventional chemical Ni/Au deposition process.

Summarizing from the above, after the conductive film that serves for entire connection is formed in the process for fabricating the patterned circuit and conductive vias, the second resist layer is additionally formed to cover other conductive trace areas outside the contact pads. Alternatively, the contact pads may be formed only on the substrate. Then, an electroplating process is performed to form a metal barrier layer on the contact pads, while the conductive trace, the conductive vias, the contact pads as well as the metal barrier layer thereon are formed in the substrate. Thus, the present invention prevents a corrosive attack of the electroless process liquid to the solder mask formed on the package substrate, peeling of the solder mask, and poor reliability as a result of pollution for the Ni/Au metal layer on the contact pads. The present invention also prevents poor fluid convection that leads to incomplete plating according to a fine circuit design. Accordingly, the present invention further resolves the problem where the Ni metal layer is not successfully plated by immersing in deposited Au, resulting either a skip in electroplating or a surface of the contact pad which is too rough to form a dense Ni/Au metal layer.

To provide a further understanding of the invention, the following detailed description illustrates embodiments and examples of the invention, it is to be understood that this detailed description is being provided only for illustration of the invention and not as limiting the scope of this invention.

BRIEF DESCRIPTION OF THE DRAWINGS

The drawings included herein provide a further understanding of the invention. A brief description of the drawings is as follows.

DETAILED DESCRIPTION OF THE PREFERRED EMBODIMENTS

Figure 1A:
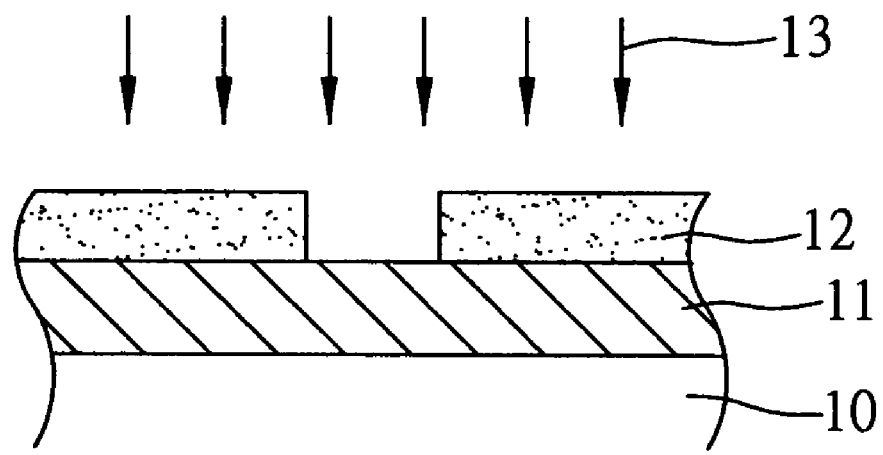
FIGS. 1A and 1B (PRIOR ART) illustrate a substrate fabricated according to a conventional wet etching process in the prior art.
Figure 1B:
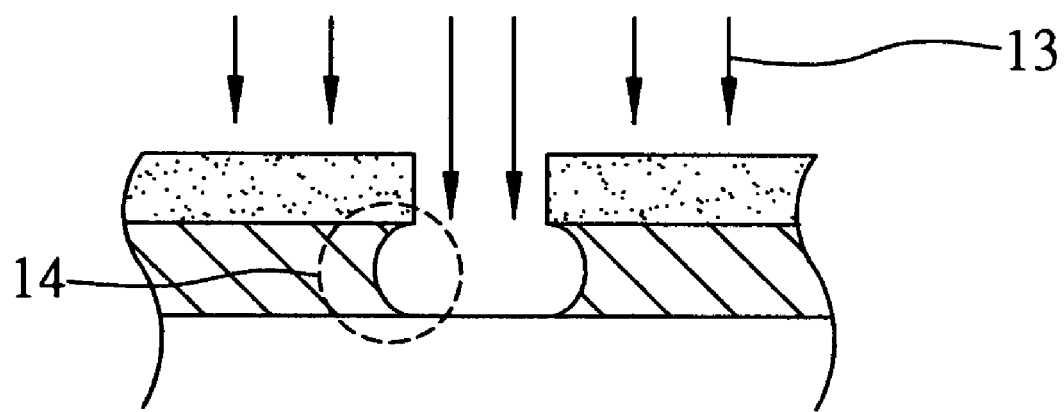
Figure 2A:
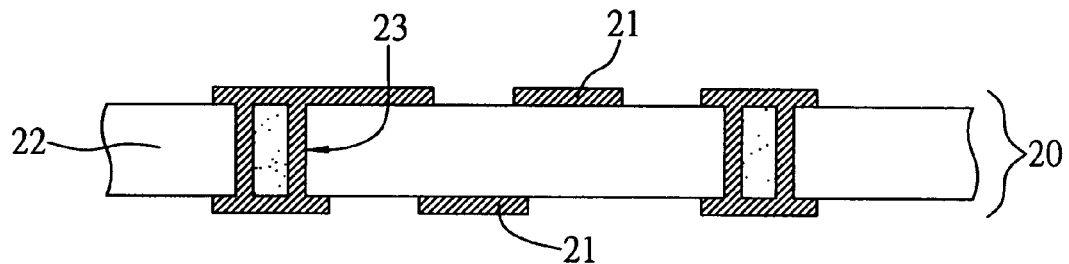
FIGS. 2A through to 2F (PRIOR ART) illustrate the substrate fabricated according to a conventional semi-additive process in the prior art.
Figure 2B:
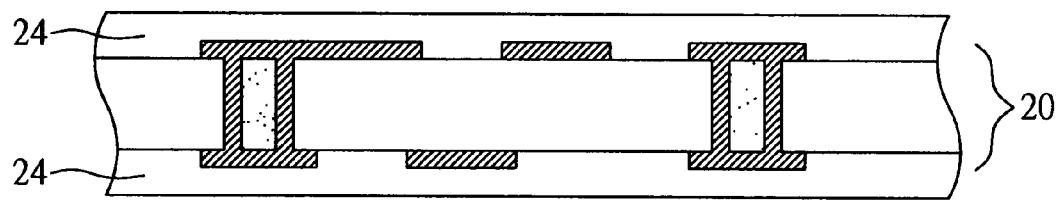
FIGS. 2G through to 2H (PRIOR ART) illustrate a conventional electroless method for forming the metal barrier layer on contact pads of the substrate.
Figure 2C:
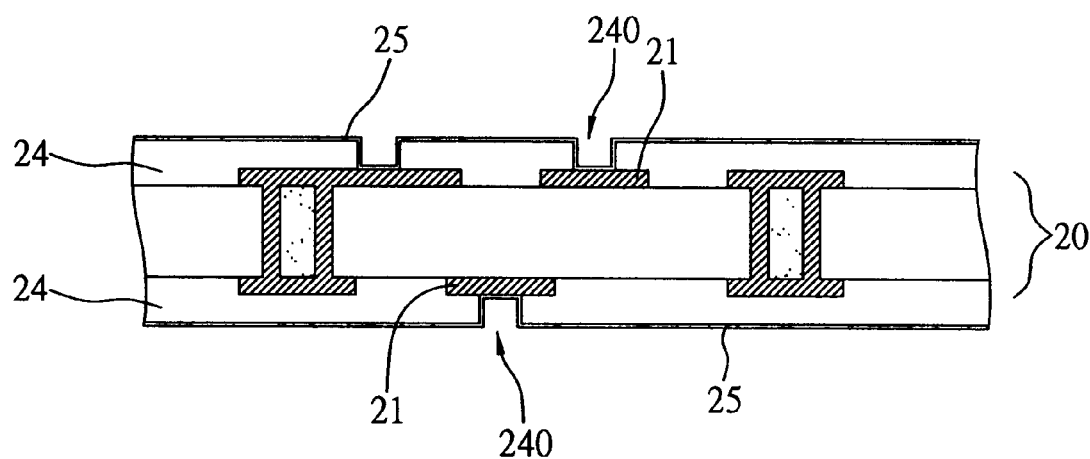
Figure 2D:
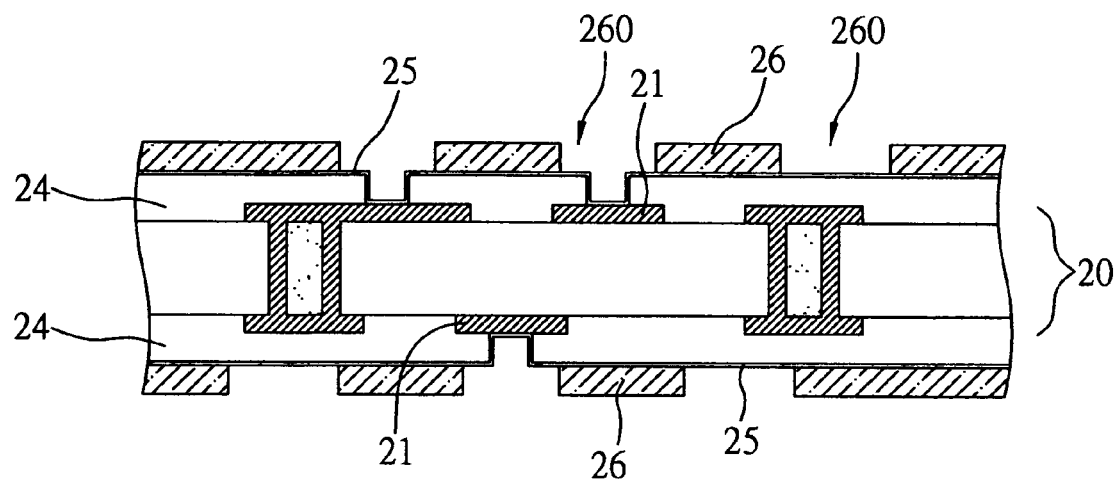
Figure 2E:
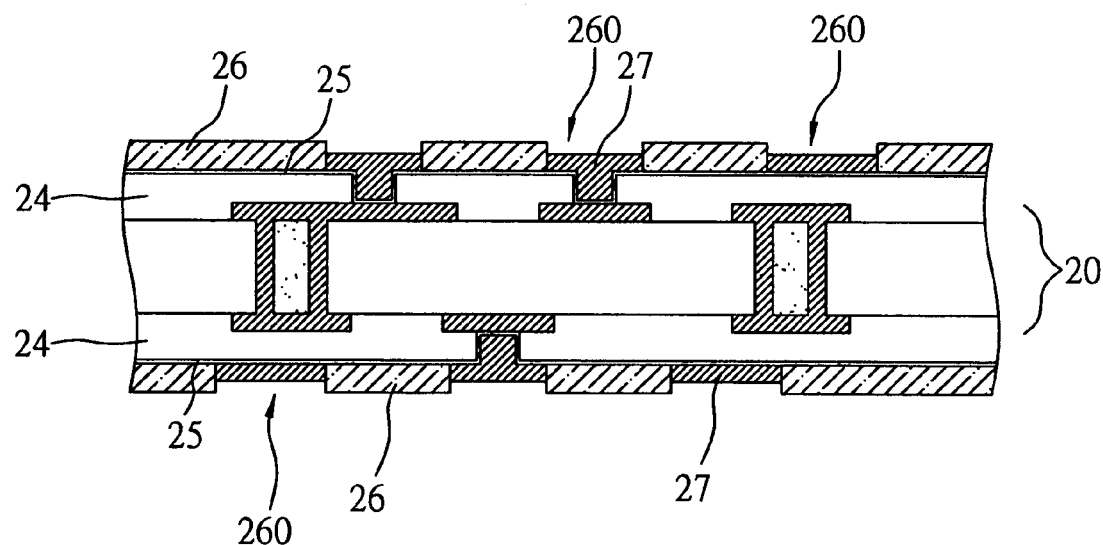
Figure 2F:
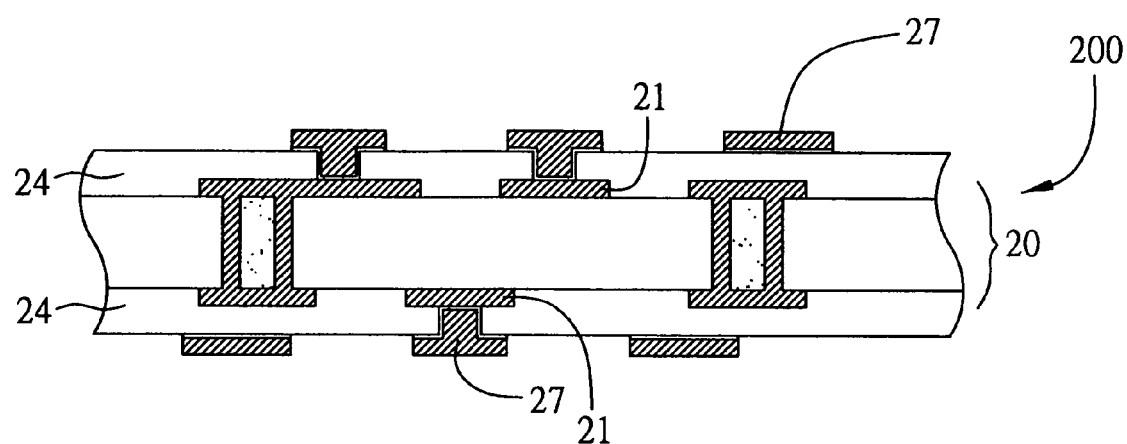
Figure 2G:
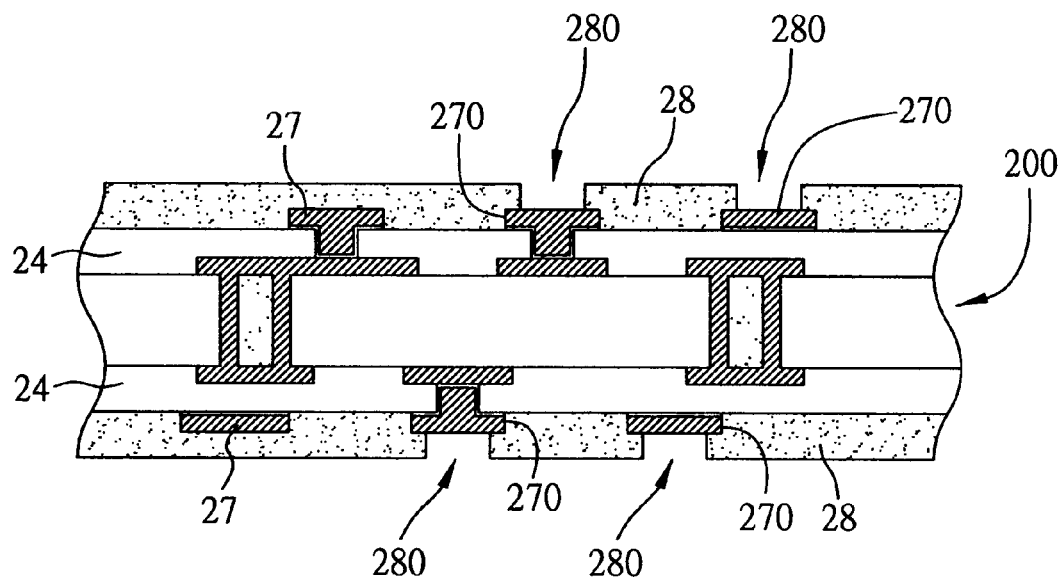
Figure 2H:
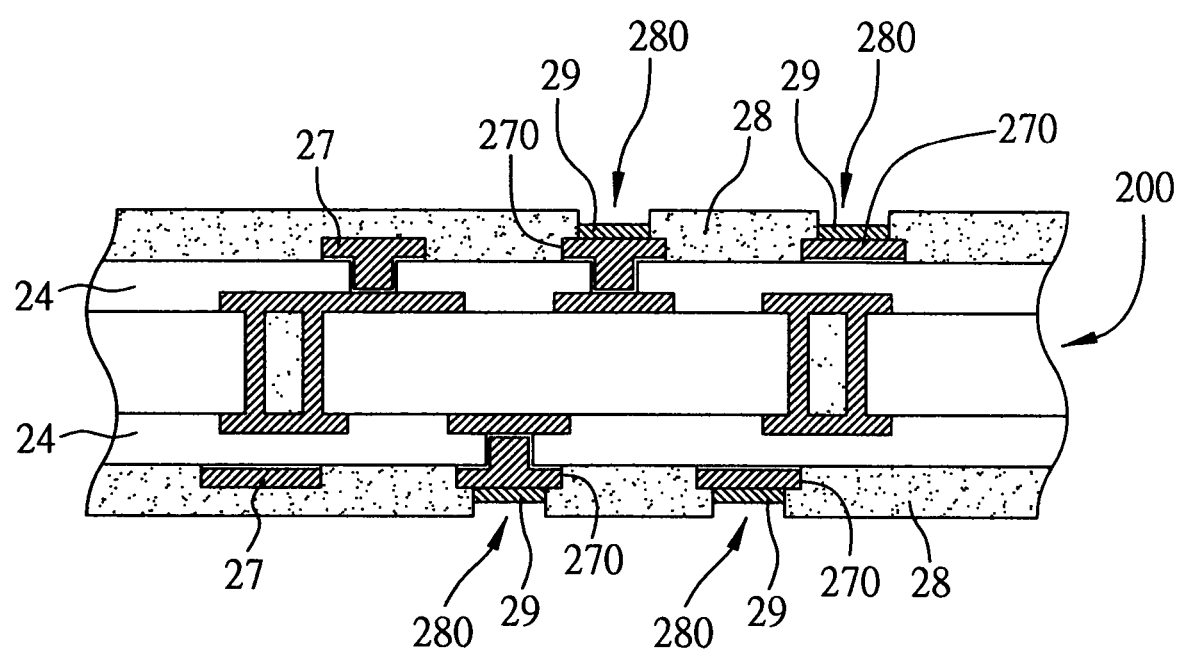
Figure 3A:
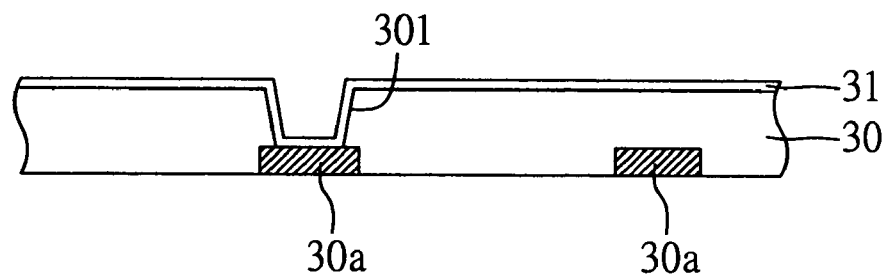
FIGS. 3A through to 3I are cross-sectional views illustrating a method for fabricating the semiconductor package substrate having the a contact pad protective layer formed thereon according to the first embodiment of the invention.

FIGS. 3A through to 3I are cross-sectional views illustrating a method for fabricating the semiconductor package substrate having the protective pads formed thereon according to the first embodiment of the invention Referring to FIG. 3A, an insulating layer 30 is provided with a plurality of insulating vias 301 formed therein, so as to expose an inner trace 30a underneath the insulating layer 30. A conductive film 31 is formed on the insulating layer 30 to cover the insulating vias 301. The insulating layer may be made of materials, such as Epoxy resin, Polyimide, Cyanate ester, Glass fiber, Ajinomoto Built-up Film (ABF), Bismaleimide Triazine (BT) and a mixture of Epoxy resin and Glass fiber (FR5). The conductive film 31 provides a current conductive path for subsequent electroplating of metal layers (including the patterned trace layer and the barrier layer above the contact pads), and the conductive layer 31 may be made of metal, alloy, and a stack of several metal layers selected from a group consisting of copper (Cu), tin (Sn), nickel (Ni), chromium (Cr), titanium (Ti), and Cu/Cr alloy. And the method for forming the conductive film 31 includes physical vapor deposition (PVD), chemical vapor deposition (CVD), non-electroplating or chemical deposition methods, such as sputtering, evaporation, arc vapor deposition (AVP), ion beam sputtering (IBS), laser ablation deposition (LAD), plasma enhanced CVD (PECVD) or plasma enhanced non-electroplating method. Based on the actual operation experience, the conductive film 31 is preferably made from non-electroplated copper particles. The insulting layer 30 may be formed on the substrate with multiple trace layers (not shown). The required front end process for the substrate may have been completed; for example, a plurality of plated through holes (PTH) and blind vias are formed in the substrate to provide connection for traces of the stacked layers.

Figure 3B:
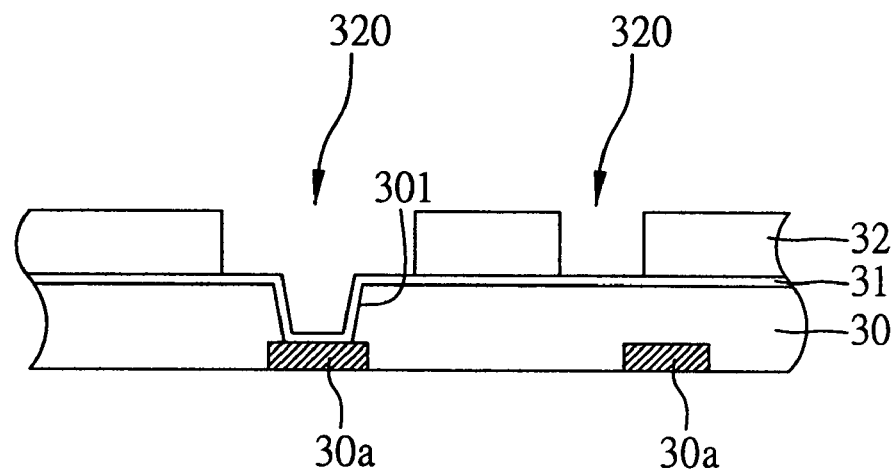

Referring to FIG. 3B, a first resist layer 32 is formed by printing, spin-coating, or adhesion to cover the conductive film 31. The first resist layer 32 may be a dry photoresist film or a photoresist in liquid form. And a plurality of openings 320 are formed in the first resist layer 32 by patterning processes, such as exposure and development to expose parts of the conductive film 31 for forming the patterned trace layer.

Figure 3C:
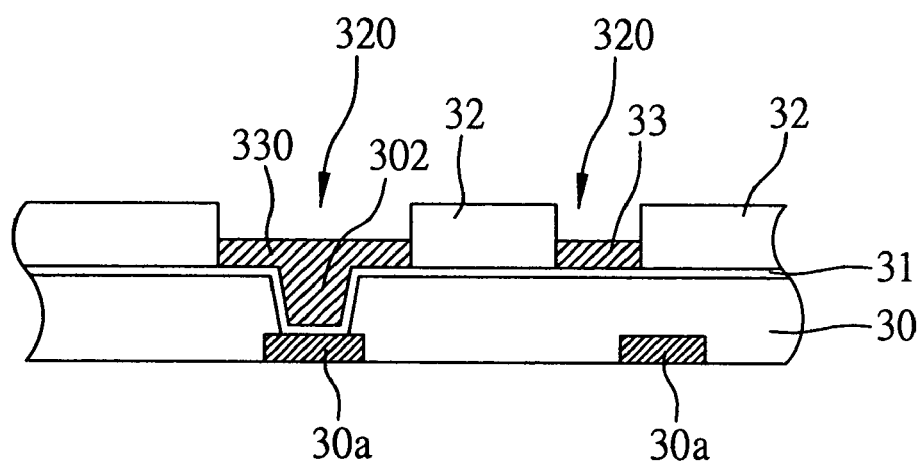

As shown in FIG. 3C, the electroplating process is conducted to form the patterned trace layer 33 and the conductive via 302 in the opening 320 and insulating vias 301, respectively. The patterned trace layer 33 has a plurality of contact pads 330 formed in the conductive vias 302 to establish connection with the inner trace 30a. The conductive vias 302 may be formed directly below the contact pad 330. The contact pad 330 may also be connected to the inner trace 30a via lead traces of the patterned trace layer 33.

Figure 3D:
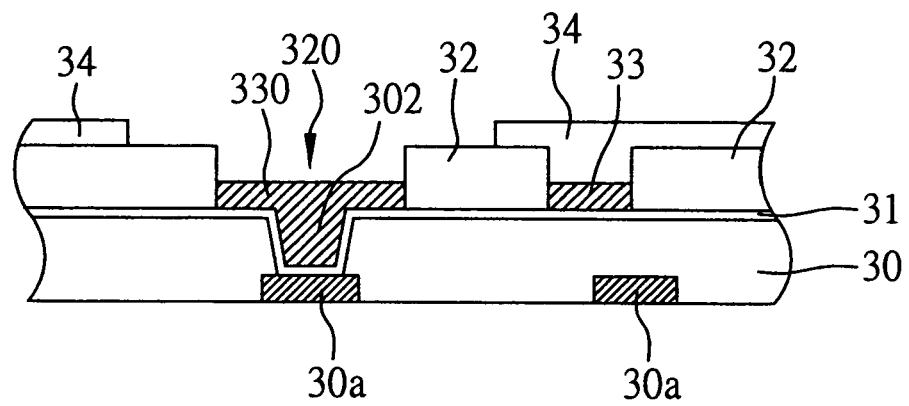

As shown in FIG. 3D, a second resist layer 34 is formed to cover the patterned trace layer 33 outside the contact pad 330, wherein the second resist layer 34 may be a dry photoresist film or a photoresist in liquid form. And a plurality of openings 320 are formed in the second resist layer 34 by patterning processes, such as exposure and development to expose the contact pads. The second resist layer 34 is made of the same material as that of the first resist layer 32.

Figure 3E:
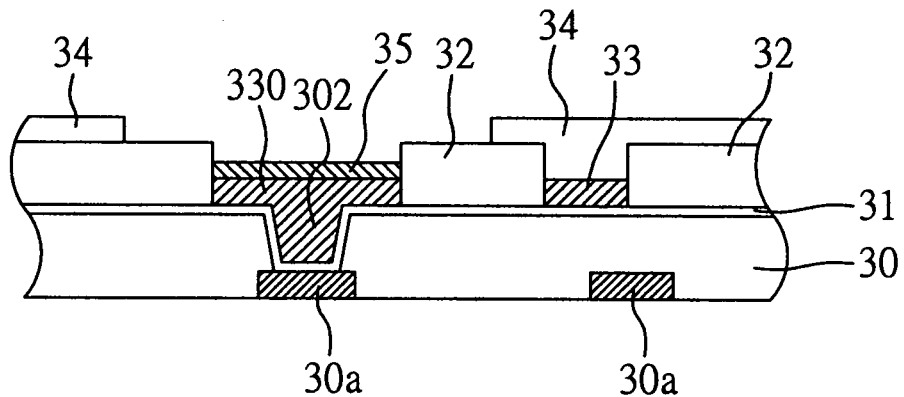
Figure 3F:
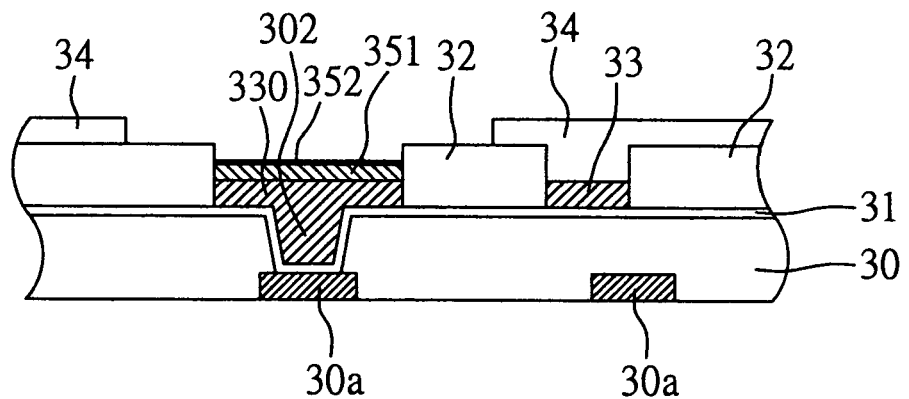

Referring to FIG. 3E, a metal barrier layer 35 is formed via a current conduction path by the electroplating process on the contact pads, so as to thoroughly cover upper surface of the contact pads 330. The current conduction path, in this case, includes the conductive film 31, the conductive vias 302, and the contact pads 330. The metal barrier layer 35 may be made of gold (Au), nickel (Ni), palladium (Pd), silver (Ag), tin (Sn), Ni/Pd alloy, Cr/Ti alloy, Ni/Au alloy, Pd/Au alloy, or Ni/Pd/Au alloy. Preferably, the metal barrier layer 35 includes an electroplated Ni/Au metal layer which is formed by electroplating a Ni layer 351, followed by a Au layer 352 (shown in FIG. 3F), such that the Ni/Au metal can be electroplated on the entire upper surface of each of the contact pads 330. As a result, the upper surface of the contact pads 330 is entirely covered with a metal barrier layer 35. It is noted that the metal barrier layer may also be made of Ni, Au, or one of other metals alone as a simple substitution for making the metal barrier layer 35. For example, the exposed surface of the contact pads 330 may be directly electroplated with Au. Therefore, the scope of the invention is not limited to the number of metals as embodied in the electroplating process described above.

Figure 3G:
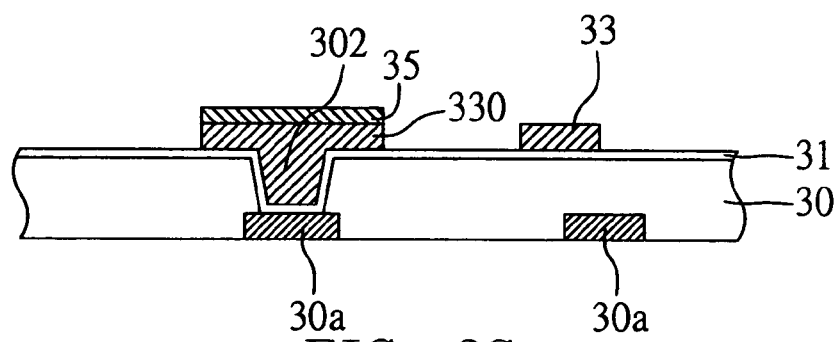

Referring to FIG. 3G, the second resist layer 34 and the first resist layer 32 are removed to form the metal barrier layer 35 covering the entire upper surface of the contact pads 35.

Figure 3H:
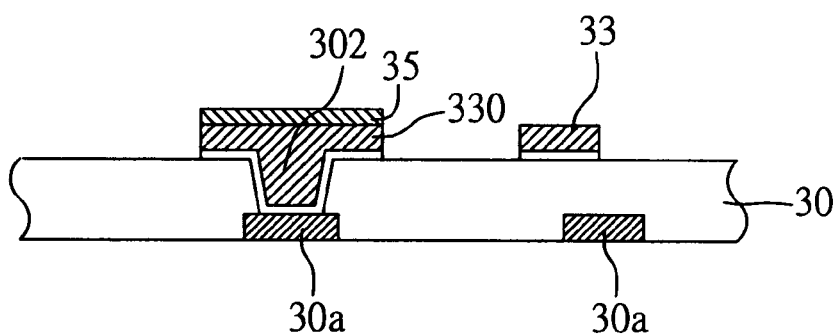

Referring to FIG. 3H, parts of the conductive film 31 covered by the first resist layer 32 are further removed by etching.

Figure 3I:
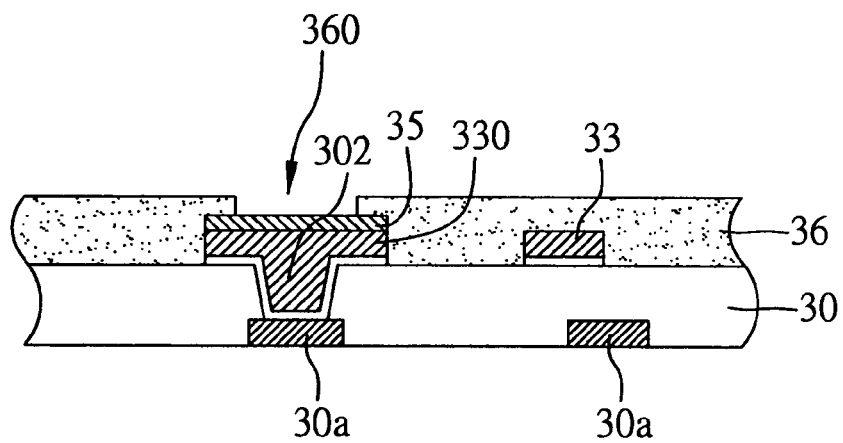

As shown in FIG. 3I, a solder mask 36, such as green paint is coated on the package substrate to protect the package substrate from contamination as a result of external environmental pollution. A plurality of openings 360 may be formed in the solder mask 36 to expose the contact pads 330 after formation of the metal barrier layer 35.

Figure 4:
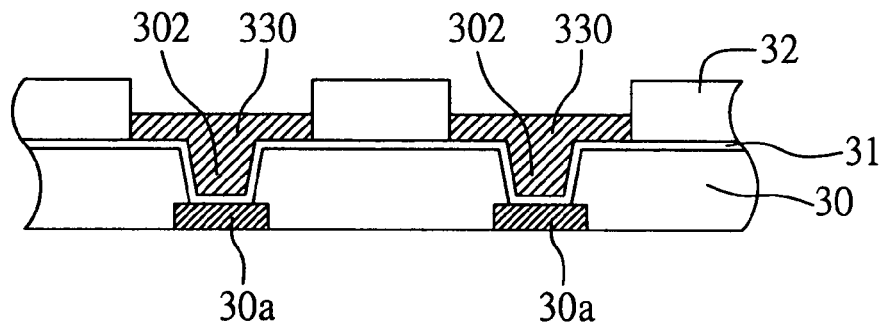
FIG. 4 is a schematic, cross-sectional view illustrating a fabrication method for a semiconductor package substrate having a contact pad protective layer formed thereon according to the second embodiment of the invention.

FIG. 4 illustrates another embodiment of the present invention, in which a plurality of contact pads 330 are directly formed on the substrate, while the conductive vias 302 and no other conductive traces are formed in the insulating layer 30. So, the contact pads 330 can connect via the conductive vias 302 formed in the insulating layer 30 to the inner trace 30a. In the subsequent electroplating process for forming the metal barrier layer on the contact pads 330, the electroplating process can be carried out directly without covering the substrate with the second resist layer to form a metal barrier layer on the exposed surface of the contact pads since the substrate is only formed with the contact pads.

Figure 5:
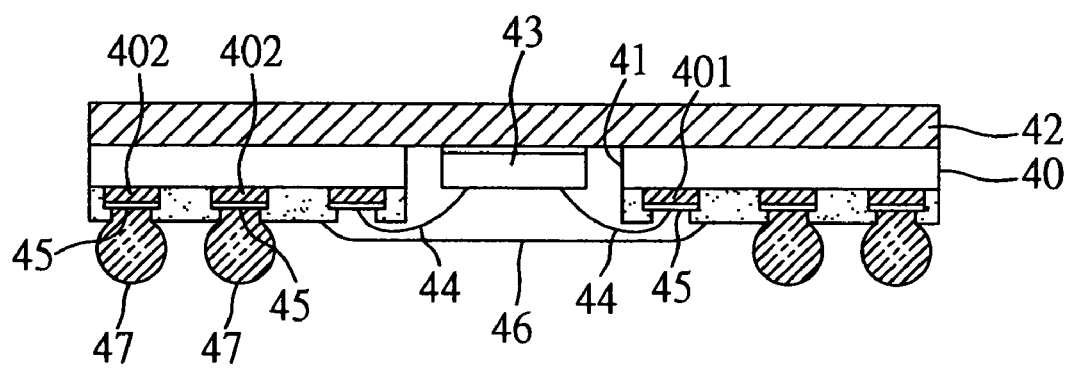
FIG. 5 is a schematic, cross-sectional view illustrating a Cavity Down Ball Grid Arrays (CDBGA) package fabricated by adopting the semiconductor package substrate having a contact pad protective layer formed thereon according to the present invention.

As described above, traces and conductive vias of the additive layers are formed by semi-additive process (SAP) in the present invention. Next, parts of the conductive traces not to be formed in to define the areas for forming the contact pads having the metal barrier layer. Alternatively, the substrate is only formed with contact pad areas FIG. 5 illustrates a Cavity Down Ball Grid Arrays (CDBGA) package fabricated according to the semiconductor package substrate of the present invention, which package has an opening formed in the substrate, and the chip is placed up side down and connected via the opening to the substrate.

The CDBGA package has at least one opening 41 formed in the substrate to penetrate upper and lower surfaces thereof. One end of the opening 41 is closed by mounting a piece of heat sink 42 on the upper surface of the substrate 40, so that a semiconductor chip 43 can accommodate in the opening 41 with its inactive surface fixed on the heat sink using a heat conductive soldering agent. With a plurality of solder wires 44 that projects out the opening 41, the semiconductor chip 43 is connected to the contact pad 401 on the lower surface of the substrate 40. A metal barrier layer 45 (such as Ni/Au metal layer) is formed on the surface of the contact pads 401, so that the solder wire (such as gold wire) can be soldered and connected to contact pads 401 effectively. Next, the semiconductor chip 43 and the solder wire 44 are covered with a package encapsulant 46 before growing a plurality of solder balls 47 on contact pads 402 of the substrate 40. A metal barrier layer 45 is also formed to cover surface of the contact pads 402, so that the solder balls 47 can be soldered and connected to the contact pads 402 effectively in order to fabricate the semiconductor package integrated with the heat sink.

Figure 6:
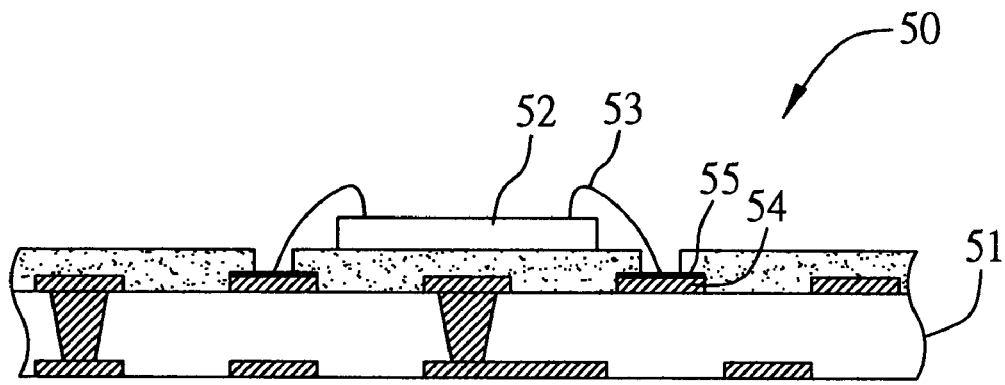
FIG. 6 is a schematic, cross-sectional view illustrating a wire-bonded package fabricated by adopting the semiconductor package substrate having a contact pad protective layer formed thereon according to the present invention.
Figure 7:
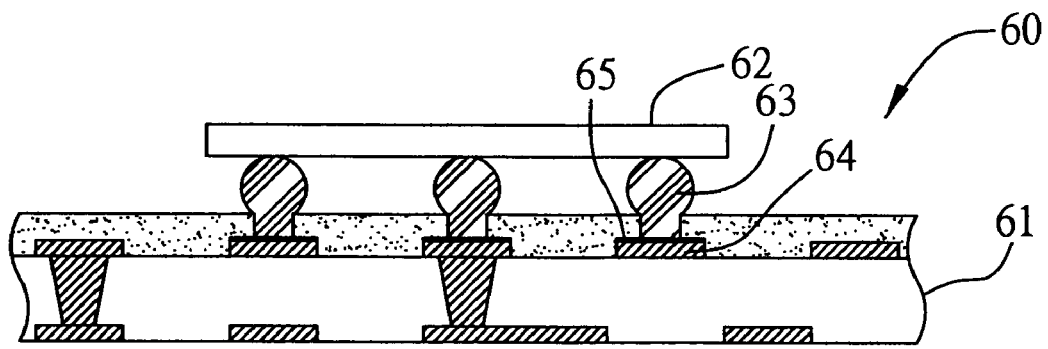
FIG. 7 is schematic, cross-sectional view illustrating a flip-chip package fabricated by adopting the semiconductor package substrate having a contact pad protective layer formed thereon according to the present invention.

FIG. 6 and FIG. 7 are cross-sectional views illustrating respectively a wire-bonded package and a flip-chip package fabricated according to the semiconductor package substrate having protective pads formed thereon embodied in the present invention.

Referring to FIG. 6, the semiconductor package substrate of the present invention is also applicable to fabrication of a wire-bonded package 50 where a wire-bonded substrate 51 is provided with at least one chip 52 mounted on the substrate 51. Then, with a plurality of solder wires, the chip 52 is connected to the contact pads 54 of the substrate 51. A metal barrier layer 55, such as Ni/Au metal layer is formed to cover the upper surface of the contact pads connected with the solder wire 53, so that the solder wire (usually the gold wire) is soldered to the contact pads 54 effectively.

As shown in FIG. 7, a flip-chip package 60 can also be fabricated by applying the semiconductor package substrate of the present invention. According to the package 60, a flip-chip substrate 61 is formed with at least one chip 62 mounted thereon. With a plurality of metal bumps 63 on circuit face of the chip 62, the chip 62 is connected to the contact pads 64 on the substrate 61 by a flip-chip method. A metal barrier layer 65, such as Ni/Au metal layer is formed to cover the upper surface of the contact pads 64 connected with the metal bumps 63, so as to prevent contact pads from corrosion as a result of external environment. In addition, the metal bumps 63 are soldered to the contact pads 64 effectively.

Summarizing from the above, the semiconductor package substrate having the protective pads formed thereon is applicable to fabrication of both the wire-bonded package substrate and the flip-chip package substrate. Furthermore, the contact pads described above may include wire-bonding pads, bump-soldering pads, pre-soldered pads, and solder ball pads. Although only a few of the contact pads are illustrated in the diagrams discussed above, the actual patterned trace layout and number of contact pads to be designed and formed on the substrate depends on the actual process needs. And the process may be implemented on either one or both sides of the substrate.

According to the semiconductor package substrate having the protective pads formed thereon and method of fabricating the same, multiple layers of thin trace structures are formed on the substrate and conductive vias are formed in the insulating layer. Meanwhile, a metal barrier layer having a similar dimension as the contact pad is formed by electroplating on the contact pads of the patterned trace structures to increase contact areas between the contact pads and the metal barrier layer, so as to provide effective electrical coupling of the contact pads with other conductive devices (such as metal bumps, solder balls, and solder wires). Therefore, contact pads are prevented from being oxidized by the external environment, and problems associated with conventional chemical deposition process are resolved, thereby reliability of the package structure is effectively improved. Although the metal barrier layer can be formed conventionally by electroplating on the contact pads, the conventional electroplating method requires further forming electroplated traces on the surface of the package substrate, so as to establish the connections to the contact pads via the electroplated traces. However, the effective wiring area for the package substrate may be significantly reduced due to layout of these electroplated traces, and problems such as signal interference may be derived as a result of the electroplated trace layout.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A fabrication method for a semiconductor package substrate having a contact pad protective layer formed thereon, the method comprising the steps of:

providing an insulating layer having a plurality of blind vias formed therein for exposing inner traces disposed underneath the insulating layer;

forming a conductive film on the insulating layer and over the blind vias;

forming a first resist layer on the conductive film, wherein the first resist layer has a plurality of openings to expose predetermined parts of the conductive film;

performing a first electroplating process to form a patterned trace layer in the openings and form conductive vias in the blind vias, wherein the patterned trace layer comprises a plurality of contact pads, and at least one of the contact pads is electrically connected to at least one of the conductive vias;

forming a second resist layer over the patterned trace layer exclusive of the contact pads, making the contact pads exposed from the second resist layer;

performing a second electroplating process to form a metal barrier layer on the contact pads; and after forming the metal barrier, removing the second resist layer, the first resist layer, and parts of the conductive film covered by the first resist layer.

2. The fabrication method of claim 1, further comprising: a solder mask for covering the patterned trace layer and having a plurality of openings to expose the metal barrier layer.

3. The fabrication method of claim 1, wherein the substrate has a multi-layered structure having a plurality of non-conductive layers, and the insulating layer is one of the non-conductive layers formed closest to an outside-exposed surface of the substrate.

4. The fabrication method of claim 1, wherein the substrate is a flip-chip package substrate or a wire-bonded package substrate.

5. The fabrication method of claim 1, wherein the contact pad is selected from the group consisting of a bump solder pad, solder ball pad, and wire-bonded pad.

6. The fabrication method of claim 1, wherein the metal barrier layer is made of a material selected from the group consisting of gold (Au), nickel (Ni), palladium (Pd), silver (Ag), tin (Sn), Ni/Pd, chromium (Cr)/titanium (Ti), Ni/Au, Pd/Au, and Ni/Pd/Au.

7. The fabrication method of claim 1, wherein the first or second resist layer is a dry photoresist film or a liquid photoresist.

* * * * *